(12) United States Patent
Brown et al.

(10) Patent No.: US 11,114,587 B1
(45) Date of Patent: Sep. 7, 2021

(54) STREAMLINED GAN-BASED FABRICATION OF LIGHT EMITTING DIODE STRUCTURES

(71) Applicant: Odyssey Semiconductor, Inc., Ithaca, NY (US)

(72) Inventors: Richard J. Brown, Ithaca, NY (US); Christopher M. Martin, Ithaca, NY (US); Shikhar Bajracharya, Ithaca, NY (US)

(73) Assignee: Odyssey Semiconductor, Inc., Ithaca, NY (US)

( * ) Notice: Subject to any disclaimer, the term of this patent is extended or adjusted under 35 U.S.C. 154(b) by 17 days.

(21) Appl. No.: 16/813,362

(22) Filed: Mar. 9, 2020

Related U.S. Application Data

(60) Provisional application No. 62/981,268, filed on Feb. 25, 2020.

(51) Int. Cl.
| | |
|---|---|
| *H01L 33/32* | (2010.01) |
| *H01L 33/00* | (2010.01) |
| *H01L 33/40* | (2010.01) |
| *H01L 27/15* | (2006.01) |

(52) U.S. Cl.
CPC ............ *H01L 33/32* (2013.01); *H01L 27/153* (2013.01); *H01L 33/0075* (2013.01); *H01L 33/40* (2013.01)

(58) Field of Classification Search
CPC ..... H01L 33/32; H01L 33/0075; H01L 33/40; H01L 27/153; H01L 33/04; H01L 33/06; H01L 33/0062; H01L 33/006
See application file for complete search history.

(56) References Cited

U.S. PATENT DOCUMENTS

| | | | |
|---|---|---|---|
| 10,446,605 B2* | 10/2019 | Zhang | H01L 33/382 |
| 2021/0057614 A1* | 2/2021 | Liu | H01L 33/007 |
| 2021/0074761 A1* | 3/2021 | Li | H01L 33/24 |

\* cited by examiner

*Primary Examiner* — Savitri Mulpuri
(74) *Attorney, Agent, or Firm* — Richard T. Ogawa; Ogawa P.C.

(57) ABSTRACT

Light Emitting Diodes (LEDs) made with GaN and related materials are used to realize high efficiency devices which emit visible radiation. These GaN-based LEDs consists of a multi-layer structure which include p-type electron confinement layers, and p-type current spreading and ohmic contacts layers located above the active region. The alignment of the etched features which penetrate near or through the active region and the ohmic contact is critical and is currently a technological challenge in the fabrication process. Any errors in this alignment and successive layers will short across the active layers of the device and result in reduced yield of functional devices. The invention described herein provides a method and apparatus to realize the successful alignment and streamlined fabrication of high-density LED array devices. The result is a higher pixel density GaN-based LED device with higher current handling capability resulting in a brighter device of the same area.

12 Claims, 12 Drawing Sheets

STREAMLINED GAN-BASED FABRICATION OF LIGHT EMITTING DIODE STRUCTURES

CROSS-REFERENCES TO RELATED APPLICATIONS

This application is a nonprovisional claiming priority to U.S. Patent Application No. 62/981,268, filed Feb. 25, 2020, which is incorporated by reference herein for all purposes.

BACKGROUND OF THE INVENTION

The present invention provides techniques, including a structure, method, and device, provided in a gallium and nitrogen containing material having improved electrical properties. In an example, the present invention includes a method and resulting structure using a beryllium species configured in a region of gallium and nitrogen containing material, such as GaN, AlGaN, InGaN, or AlGaInN. Merely by way of example, the invention has been applied to a light emitted diode device. However, the techniques can be applied other types of device structures and applications.

Light-emitting diode (LED) devices have revolutionized the world. In the early 1960's, Nick Holonyak, who is an American engineer and educator, developed an LED that emitted visible red light instead of infrared light. Holonyak was then working at General Electric's research laboratory in Syracuse, N.Y. The use of red LEDs proliferated into indicator, display, and other devices. Other types of LEDs, such as blue LEDs, relied upon gallium nitride based materials, and have also proliferated into displays, such as those used in a smart phone, flat panel displays, and general lighting. Although many advances have occurred in the field of LEDs and their processing, various limitations still exist.

From the above, it is seen that techniques for improving electronic devices are highly desirable.

BRIEF SUMMARY OF THE INVENTION

According to the present invention, techniques, including a structure, method, and device, in a gallium and nitrogen containing material having improved electrical properties are provided. In an example, the present invention includes a method and resulting structure using a beryllium species configured in a region of gallium and nitrogen containing material, such as GaN, AlGaN, InGaN, or AlGaInN. Merely by way of example, the invention has been applied to a light-emitting diode (LED) device. However, the technique can be applied other types of device structures and applications.

In an example, the present invention provides a method for fabricating a microLED array. The method includes providing a sapphire substrate member comprising a surface region or other substrates can be used. The method includes forming an n-type gallium nitride material overlying the surface region. The method includes forming an active layer overlying the n-type gallium nitride material. In an example, the active layer has a thickness ranging from about 50 to about 100 nanometers and is characterized by three to fifteen quantum well regions, but can be others. In an example, the method includes forming a p-type gallium nitride material overlying the active layer to form a stack including the n-type gallium nitride material, the active layer, and the p-type gallium nitride material. The stack has not been processed or patterned in any manner.

In an example, the method includes forming a plurality of p-type contact regions overlying the p-type gallium and nitride material. In an example, each of the p-type contact regions has an ohmic contact region and an overlying capping metal layer. In an example, the plurality of p-type contact regions are configured as an N by M array, where N is 10 to 5000 and M is 10 to 5000, such that each of the p-type contact regions has a size of a pixel element. In an example, the method includes forming an n-type contact frame using a photolithography lift off and a metal deposition process and performing an etching process to remove material in a plurality of exposed regions while the n-type contact frame and the plurality of p-type contact regions mask underlying regions.

In an example, the method includes causing formation of a plurality of the pixel elements, each of which has been separated from each other, and a trench region to expose a portion of the n-type gallium nitride material during the etching process. That is, the etching process is configured as a self-aligned process. In an example, the method includes forming an n-type contact region comprising a metal fill material overlying an exposed portion of the n-type gallium nitride material.

One or more benefits are achieved over pre-existing techniques using the invention. In particular, the invention enables a cost-effective technique for providing improved electrical characteristics of a gallium and nitrogen containing material. In an example, the technique uses a beryllium species configured with implantation techniques into a crystalline gallium and nitrogen containing material to form a low resistivity material for LED devices, among others. In a specific embodiment, the present device can be manufactured in a relatively simple and cost effective manner. Depending upon the embodiment, the present apparatus and method can be manufactured using conventional materials and/or methods according to one of ordinary skill in the art. The present device uses a gallium and nitrogen containing material that is single crystalline or can be other configurations. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

According to the present invention, techniques, including a structure, method, and device, in a gallium and nitrogen containing material having improved electrical properties are provided. In an example, the present invention includes a method and resulting structure using a beryllium species configured in a region of gallium and nitrogen containing material, such as GaN, AlGaN, InGaN, or AlGaInN. Merely by way of example, the invention has been applied to a light-emitting diode (LED) device. However, the techniques can be applied other types of device structures and applications.

As background, production yield of GaN-based LEDs often suffers from poor alignment of integrated elements during fabrication processing. A small overlay error in a lithography step can result in a large number of shorted devices greatly impacting the yield to cause problems. Such problems become more pronounced when the lateral dimensions of the LED are reduced as is required for high resolution virtual reality displays. In the present invention, we have discovered an advancement that greatly reduces the number of required highly aligned lithography layers by combining the formation of the ohmic contacts and required etch mask layers.

Figure 1:
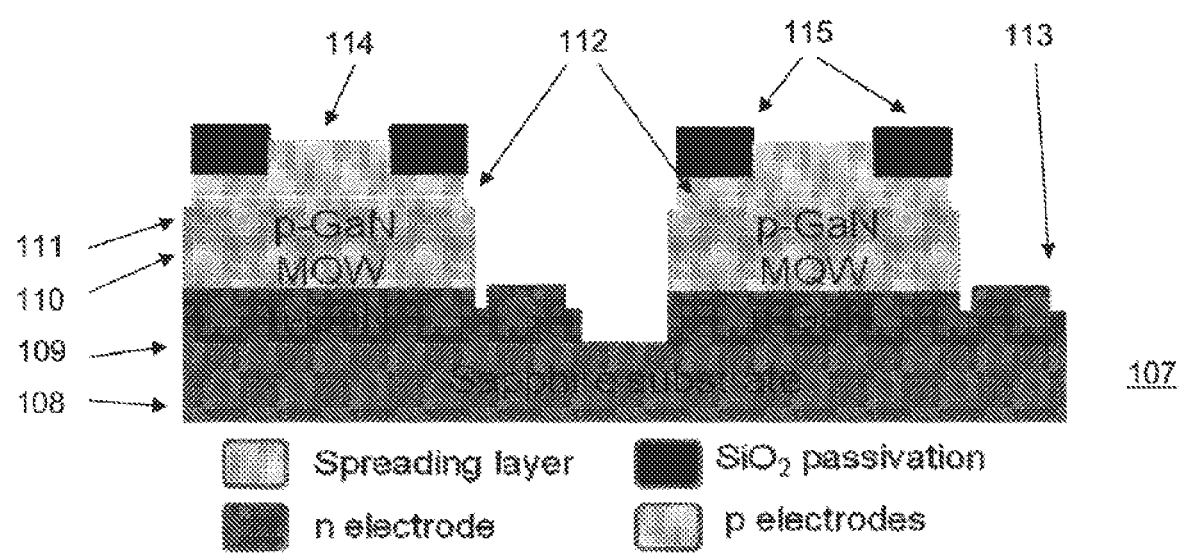
FIGS. 1 and 2 are simplified diagrams of conventional LED devices.
Figure 2:
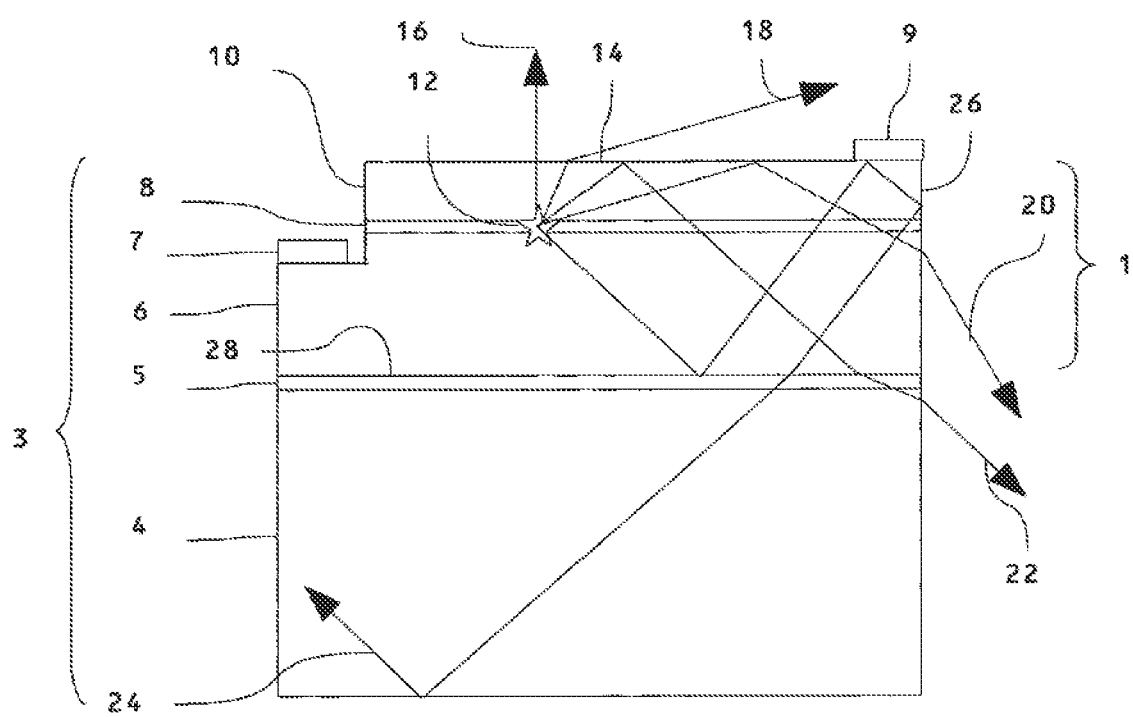

FIGS. 1 and 2 are simplified diagrams of conventional LED devices. FIG. 1 illustrates an a pair of LED pixels from U.S. Patent Publication No. US2011/0309378 A1, while FIG. 2 illustrates an LED device from European Patent No. EP2334978 B1.

FIG. 1 shows a cross-sectional diagram of two neighbored LED pixels 107 in an LED micro-array. An n-GaN layer 109, a Multiple Quantum Well (MQW) 110, and a p-GaN layer 111 were grown on a substrate 108. Silicon dioxide (SiO) masks were used for inductively coupled plasma (ICP) etching. The LED wafer was etched all the way down to the substrate. Rows of the micro-array were defined and isolated in this step. A Plasma-Enhanced Chemical Vapor Deposition (PECVD) SiO, mask and an ICP were used again to define the mesa structure of each LED pixel. A thin Ni/Au (5/5 nm) current spreading layer 112 was deposited onto the p-GaN layer 111 to form p-electrodes. Annealing in the atmospheric ambient at 570° C. for 5 minutes was performed. Then, a metal layer 113 was evaporated to form n-electrodes and a reflective layer on the p-electrodes simultaneously. Finally, Silicon dioxide passivation 115 was applied onto the wafer. Openings 114 in the SiO layers were defined for flip-chip bonding.

A limitation of the aforementioned device is each of the trenches is fairly deep, in the order of seven microns, and extends to sapphire substrate member. The etching depth and stop at the sapphire leads to problems in yield, along with the multi-layers, and causes difficulty in processing, and lower yields.

A typical light-emitting diode (LED) device 3 is shown in FIG. 2. A substrate 4, such as sapphire, has an n-type gallium nitride (GaN) layer 6 formed on its surface, typically with intermediate functional layer 5 such as a lattice matching layer or a release layer. A multiple quantum well layer 8 and p-type GaN layer 10 are formed over the substrate 4. The active layer 1 thus comprises the layers 6, 8, 10 and perhaps part of layer 5 and may further comprise electrode contacts and other functional elements as part of the LED structure. When a voltage is applied across the device by means of electrodes 7, 9, emission 12 occurs within the layer 8.

In this specification, the term LED is used to include semiconductor LEDs including inorganic LED, organic LEDs and polymer LEDs.

When a voltage is applied across the device by means of electrodes 7, 9, emission 12 occurs within the layer 8 Light rays 16, 18 transmitted close to normal to the outer surface 14 are transmitted. However, light rays 20, 22, 24 are internally reflected due to the relatively high refractive indices within the device 3. Light rays 20, 22 can exit through the edge 26 of the device. Such devices have relatively high internal absorption coefficients to light passing through the layers 6, 8, 10, resulting in loss of efficiency and increased device heating. As the dimensions of the device increases, the path length of many of the internally reflected light rays 20, 22, 24 increases and so the proportion of light rays that can escape from the device decreases, resulting in decreasing external efficiency for larger devices as size increases. In order to improve the external efficiency, surface roughening or photonic bandgap structures are added to the top surface 14. In thin film flip chip devices, the substrate 4 is further removed so as to improve external light coupling. In this case, the surface 28 is modified. Further the edges of the device may be formed by an etching process prior to cutting to provide improved facet quality.

A limitation of the technique described is inefficient light extraction.

In an example, the present invention is related to a micro-LED array. In an example, the micro-LED has a pixel size ranging in a micron size range. A total size of the array is about 100 pixels to about 25,000,000 pixels, but can be others.

In an example, the multi-layer structures for GaN-based LEDs take on many forms depending on the choice of the growth substrate and the final device geometry including flip chip designs where a carrier substrate is used and the growth substrate is removed. This invention relates to the top of the LED multi-layer epitaxial structure as it appears on the growth substrate and the required fabrication steps. These are the p-type epitaxial layers which are almost always grown on top of the active region.

FIGS. 3 to 11 are simplified diagrams illustrating various stages of a method of fabricating a microLED array according to an example of the present invention. Reference numbers repeated in subsequent figures refer to the same elements as preceding figures. Dotted lines are used to indicate that only a portion of a device is shown. Those of ordinary skill in the art will recognize other variations, modifications, and alternatives to the following techniques described and materials used.

Figure 3:
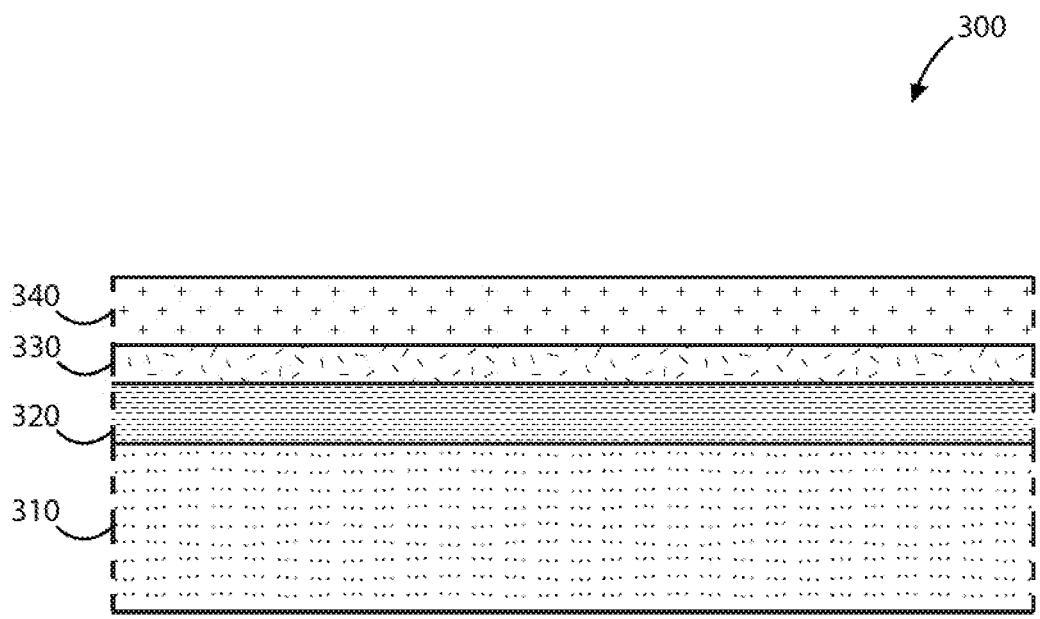
FIGS. 3 to 11 are simplified diagrams illustrating various stages of a method of fabricating a microLED array according to an example of the present invention.

In FIG. 3, a typical GaN-based epitaxial LED structure 300 is shown on a substrate member 310. The substrate member 310 can include a sapphire material or the like. The n-type layers 320 are shown below the active region 330 and the p-type layers 340 are shown on top of the active region 330. The n-type layers 320 and the p-type layers 340 can include gallium and nitrogen containing materials, such as GaN, AlGaN, InGaN, or AlGaInN or the like. The active region 330 can be multi-quantum well (MQW) with GaN barrier layers (located between the quantum wells) and InGaN quantum wells, which are indicated in FIG. 1 as the active layer. The active region 320 may also include doped barrier MWQ regions.

Figure 4:
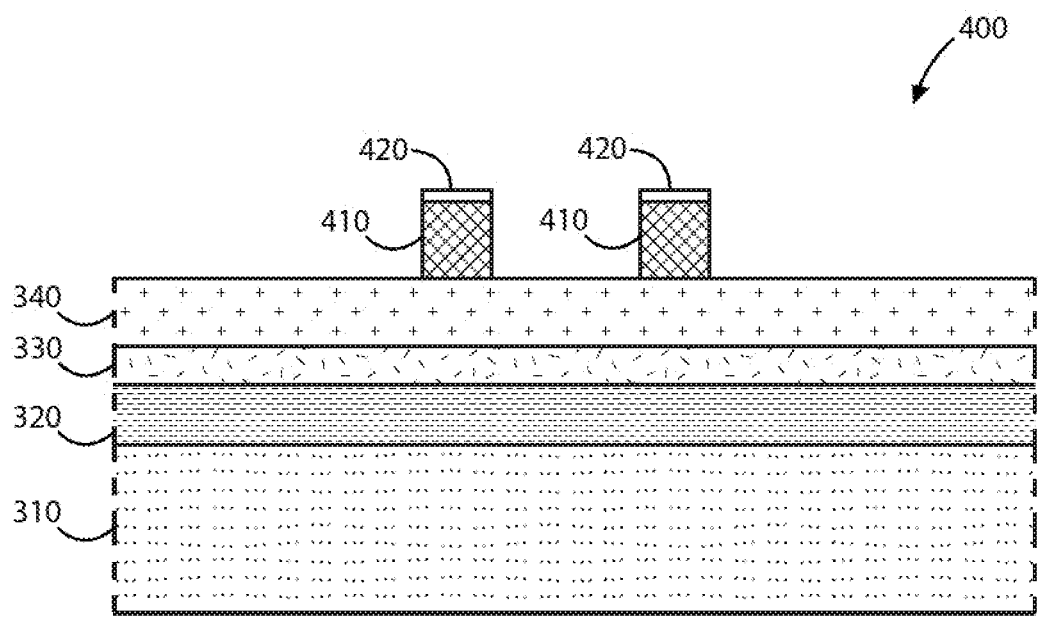

In FIG. 4, device 400 shows that the metal 410 required to form the P type ohmic contact and the etch mask 420 is deposited and patterned. This metal 410 is typically Ti/Pt/Au capped with nickel, or other suitable material, for the etch mask 420. By applying the contact metal 410 and the etch mask 420 in one step ensures perfect alignment of these structures.

Figure 5:
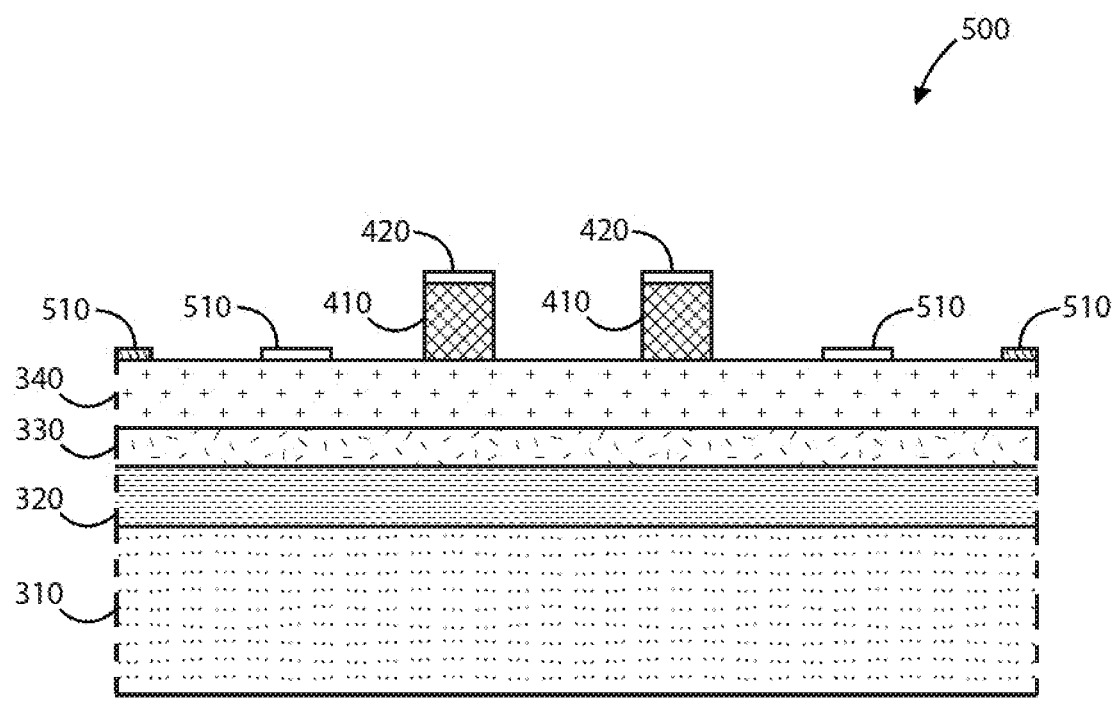

In FIG. 5, device 500 shows that the etch mask 510 required for the etch of the N contact frame has been added. This allows the entire structure to be etched using in one step.

Figure 6A:
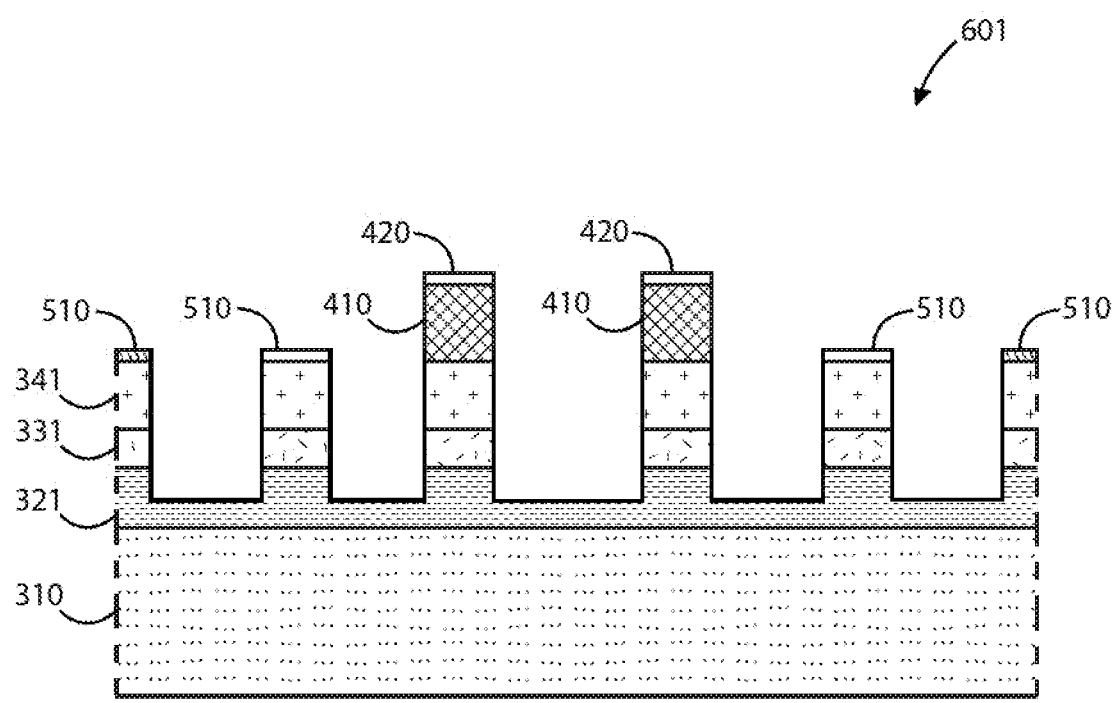
Figure 6B:
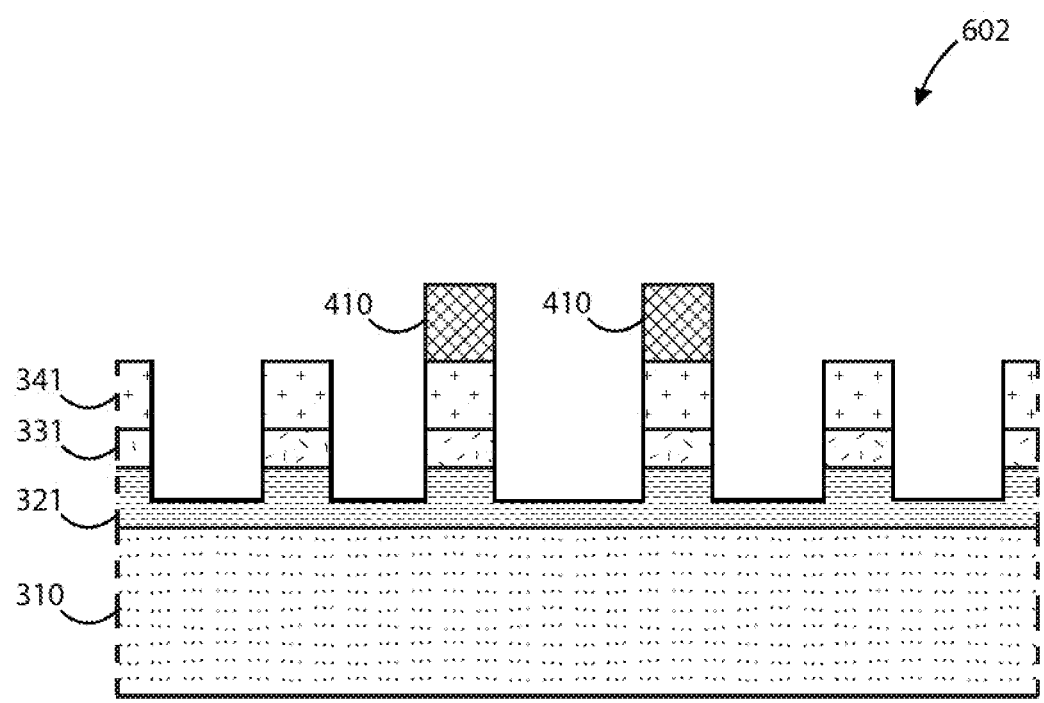

In FIG. 6A, device 601 is shown after the device etch has been completed, and the required wet chemistry/plasma clean up procedures have been completed. As shown, the device etch can result in portions removed from the n-type layers 320, the active layer 330, and the p-type layers 340, resulting one or more trench regions within etched n-type layers 321, etched active layer 331, and etched p-type layers 341. The formation of one or more trench regions can include forming and separating a plurality of the pixel elements (including p-type contact regions 410 and the underlying stack materials, and to expose one or more portions of the n-type gallium nitride material 321. In FIG. 6B, device 602 shows that the etch mask 420 and 510 will be stripped using a wet etchant.

Figure 7:
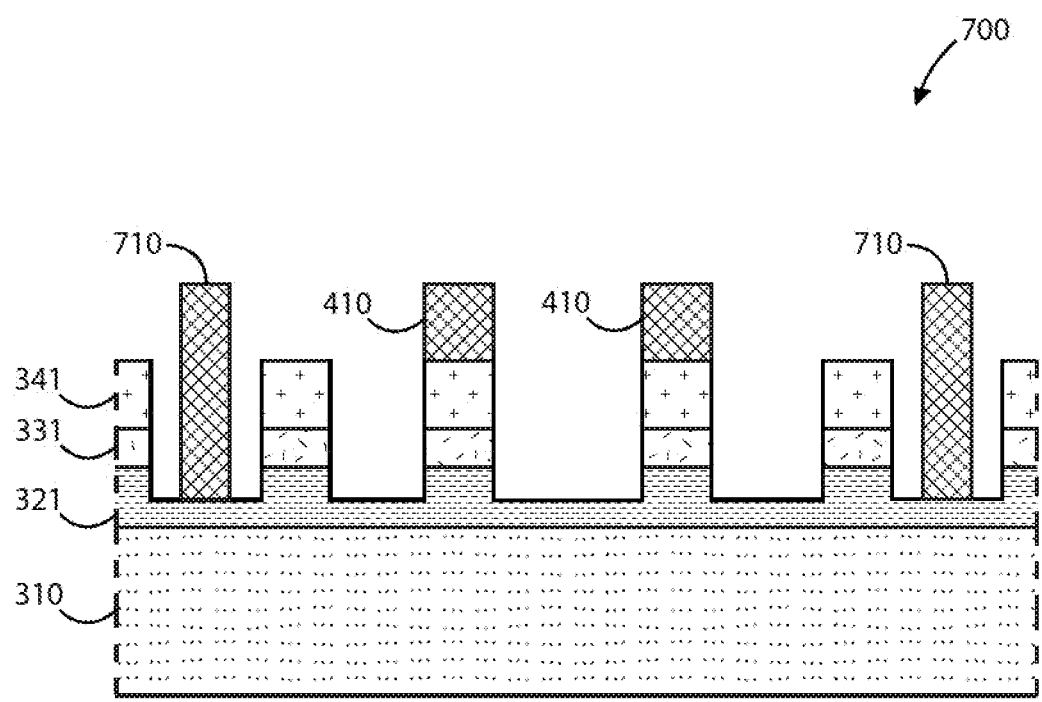

In FIG. 7, device 700 shows that the contact metal 710 into the N-type region has been deposited so that the top of the metals 710 aligns with the top of the ohmic contact metal 410. This N-type contact will contact all of the devices across the array. Additionally, having the top of the metals being on the same plane will help facilitate packaging and final device processing.

Figure 8:
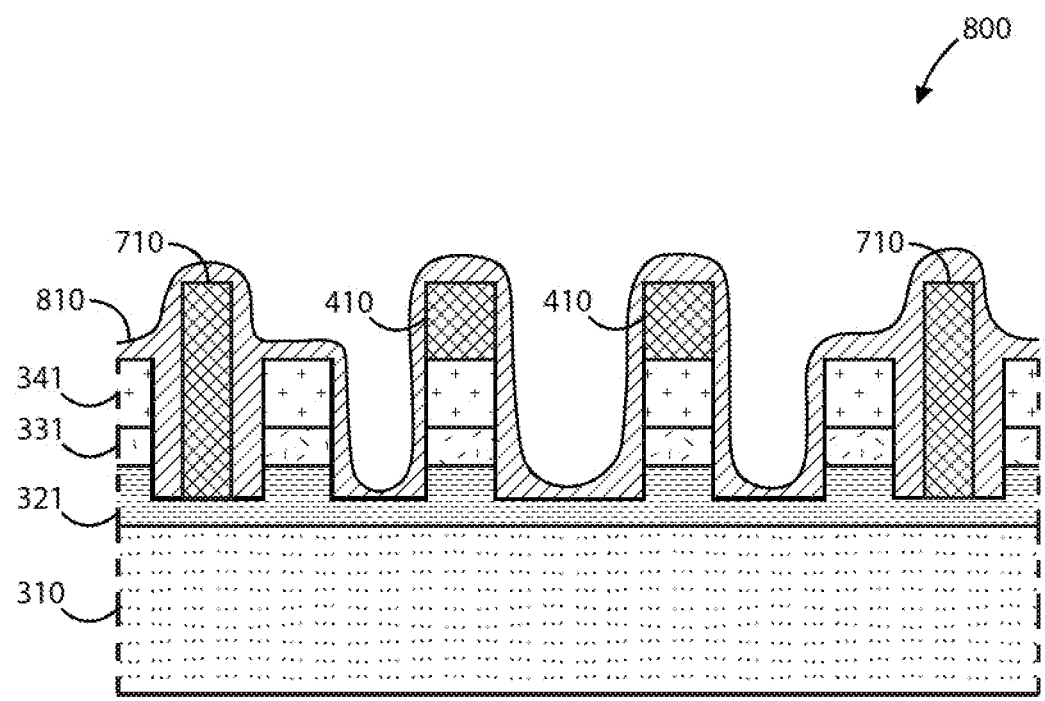

In FIG. 8, device 800 shows that a layer of dielectric 810, such as SiO2 or SiNx or the like, has been deposited covering all of the structures and passivating the side walls of the structures.

Figure 9:
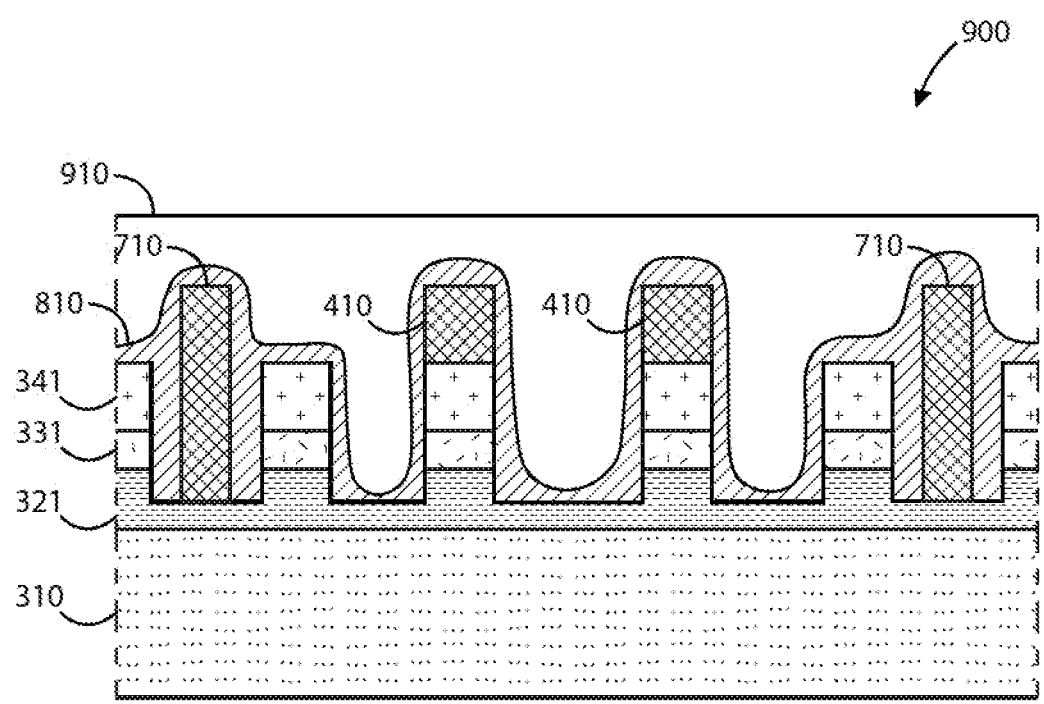

In FIG. 9, device 900 shows that a layer of planarizing resist 910 has been applied covering all of the structures.

Figure 10:
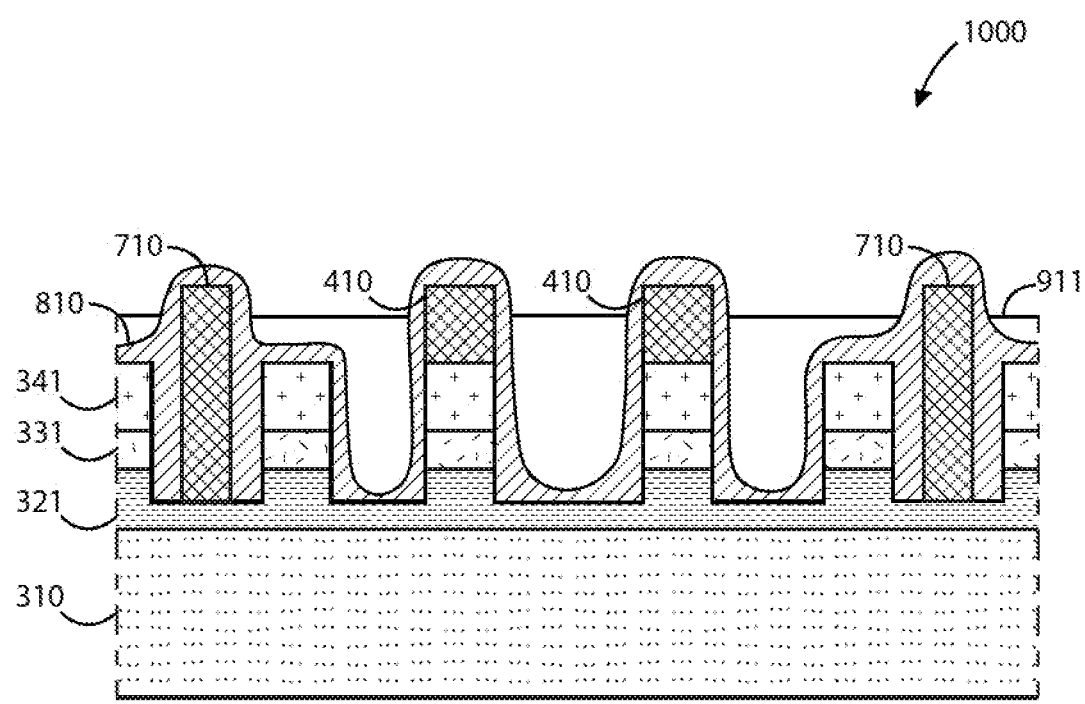

In FIG. 10, device 1000 shows that the planarized resist 910 is etched back using oxygen plasma, resulting in etched planarized resist 911, to expose the tops of the LED devices and the bulk contact into the N-type frame.

Figure 11:
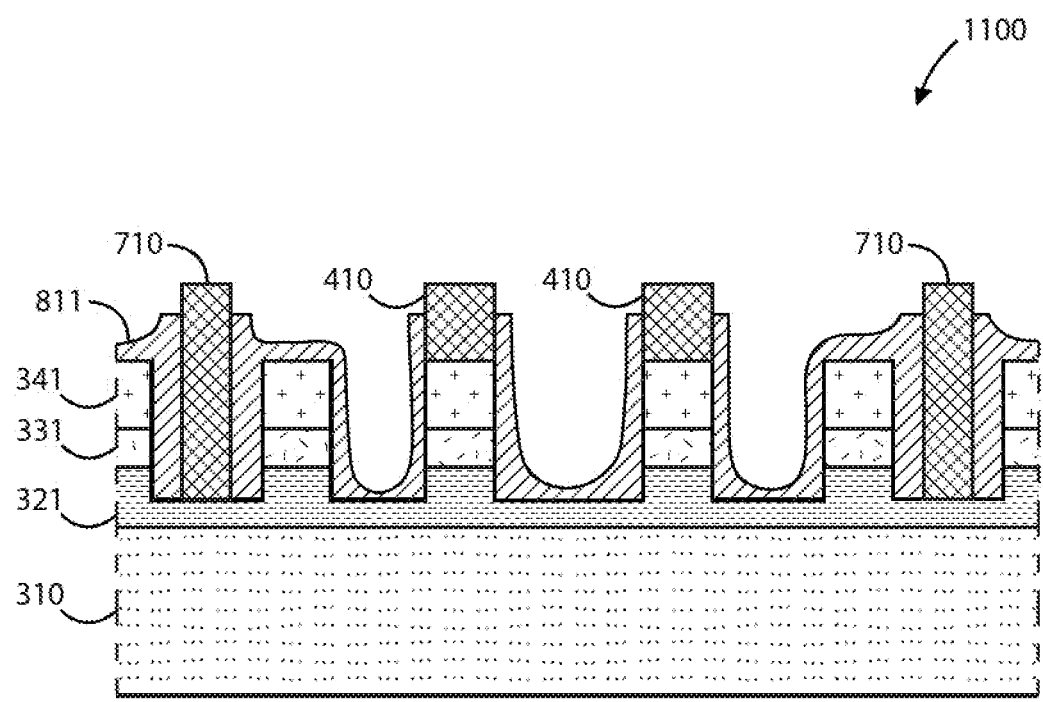

In FIG. 11, device 1100 shows that the passivation layer 810 is opened, resulting in opened passivation layer 811, on the top of the metal contacts 410 and 710 using reactive-ion etching (RIE) plasma and fluorene chemistry compatible with the dielectric passivation used, or other like processes. The resist 911 can now be removed and the fabrication process of the devices has been completed.

In an example in reference to the aforementioned specification, the present invention provides a method for fabricating a microLED array. The method includes providing a sapphire substrate member comprising a surface region or other substrates can be used. The method includes forming an n-type gallium nitride material overlying the surface region. The method includes forming an active layer overlying the n-type gallium nitride material. In an example, the active layer has a thickness ranging from about 50 to about 100 nanometers and is characterized by three to fifteen quantum well regions, but can be others. In an example, the method includes forming a p-type gallium nitride material overlying the active layer to form a stack including the n-type gallium nitride material, the active layer, and the p-type gallium nitride material. The stack has not been processed or patterned in any manner.

In an example, the method includes forming a plurality of p-type contact regions overlying the p-type gallium and nitride material. In an example, each of the p-type contacts has an ohmic contact region and an overlying capping metal layer. In an example, the plurality of p-type contact regions are configured as an N by M array, where N is 10 to 5000 and M is 10 to 5000, such that each of the p-type contact regions has a size of a pixel element. In an example, the method includes forming an n-type contact frame using a photolithography lift off and a metal deposition process and performing an etching process to remove material in a plurality of exposed regions while the n-type contact frame and the plurality of p-type contact regions mask underlying regions.

In an example, the method includes causing formation of a plurality of the pixel elements, each of which has been separated from each other, and a trench region to expose a portion of the n-type gallium nitride material during the etching process. That is, the etching process is configured as a self-aligned process. In an example, the method includes forming an n-type contact region comprising a metal fill material overlying an exposed portion of the n-type gallium nitride material.

In an example, the present invention provides a microLED array device. The device includes a substrate member comprising a surface region, an n-type gallium nitride material formed overlying the surface region, and an active layer having a predetermined thickness formed overlying the n-type gallium nitride material, and a p-type gallium nitride material formed overlying the active layer to form a stack including the n-type gallium nitride material, the active layer, and the p-type gallium nitride material. The device also includes a plurality of p-type contact regions, each having an ohmic contact region, formed overlying the p-type gallium and nitride material. In an example, the plurality of p-type contact regions are configured as an N by M array, such that each of the p-type contact regions has a size of a pixel element. The device includes a plurality of the pixel elements formed from the p-type contact regions and the stack, wherein each of the pixel elements is separated from each other. Further, the device includes a trench region formed within the stack to expose a portion of the n-type gallium nitride material and an n-type contact region formed within the trench region comprising a metal fill material overlying an exposed portion of the n-type gallium nitride material. Those of ordinary skill in the art will recognize other variations, modifications, or alternatives.

In an example, the n-type contact regions are configured as a cathode. In an example, each of the p-type contact regions forms an anode for each of the pixel elements. In an example the p-type gallium nitride material comprises a magnesium impurity and the n-type gallium nitride material comprises a silicon impurity.

In an example, the capping metal layer for the plurality of p-type contact regions acts as a etch mask during the etching process. In an example, the etching process is selected from reactive ion etch or inductively coupled plasma etching.

In an example, the n-type contact region is an ohmic contact to the n-type gallium nitride material. In an example, each of the p-type contact regions is configured as a bump bondable pad. In an example, the etching process comprises a post cleanup etching using a wet etch or a plasma etch to remove any surface roughness from a primary etching process. In an example, the n-contact region provided in the n-type contact frame serves as a sheet contact to form an anode for each pixel element.

In an example, the method includes forming the n-type contact region comprises utilizing a liftoff process to metalize the n-type contact region resulting in a formation of a bondable frame structure having a same height as an upper surface of the p-type contact regions.

In an example, the method further comprising forming a conformal passivation layer overlying a surface region of a plurality of exposed regions of the plurality of pixel elements. In an example, the method further comprising forming a planarizing layer overlying a topography of the conformal passivation layer; removing a thickness of the planarizing layer to expose an upper region of the n-type contact region and a portion of each of the p-type contact regions, the upper region of the n-type contact region having a portion of the conformal passivation layer and the portion of each of the p-type contact regions having a portion of the conformal passivation layer. In an example, the method further comprising removing the portion of the conformal passivation layer overlying each of the p-type contact regions and the portion of the conformal passivation layer overlying the upper region of the n-type contact region to expose each of the p-type contact regions and expose the n-type contact region.

In an example, the array has a size of about five millimeters to about fifty millimeters along a length of the array, but can be other sizes. In an example, the metal fill comprises a titanium entity and a gold entity. In an example, each pixel element is self-aligned during the etching process. In an example, the array has an electrical yield of greater than 99.5% or greater. Of course, there can be other variations, modifications, and alternatives.

These embodiments are not meant to limit the scope of the invention but only serve as illustrated examples. Any LED fabrication process that incorporates this combined contact metal/bump bonding pad/etch mask in one step which results in and enables the bulk arrayed contact formation. This advancement results in a more robust process by reducing the total number of required processing steps greatly reducing alignment errors from the overlayment of lithographic steps. All of these advancements have a direct impact on the device yield and can help to lead to increased pixel density and size.

The above sequence of steps is used to form microLED devices on a die from a substrate structure according to one or more embodiments of the present invention. Depending upon the embodiment, one or more of these steps can be combined, or removed, or other steps may be added without departing from the scope of the claims herein. One of ordinary skill in the art would recognize other variations, modifications, and alternatives. Further details of this method are provided throughout the present specification and more particularly below.

While the above is a full description of the specific embodiments, various modifications, alternative constructions and equivalents may be used. As used herein, the term "substrate" can mean the bulk substrate or can include overlying growth structures such as a gallium and nitrogen containing epitaxial region, or functional regions, combinations, and the like. Therefore, the above description and illustrations should not be taken as limiting the scope of the present invention which is defined by the appended claims.

What is claimed is:

1. A method for fabricating a microLED array, the method comprising:
   providing a sapphire substrate member comprising a surface region;
   forming an n-type gallium nitride material overlying the surface region;
   forming an active layer overlying the n-type gallium nitride material, the active layer having a thickness ranging from about 50 to about 100 nanometers and characterized by three to fifteen quantum well regions;
   forming a p-type gallium nitride material overlying the active layer to form a stack including the n-type gallium nitride material, the active layer, and the p-type gallium nitride material;
   forming a plurality of p-type contact regions overlying the p-type gallium and nitride material, each of the p-type contact regions having an ohmic contact region and an overlying capping metal layer, the plurality of p-type contact regions being configured as an N by M array, where N is 10 to 5000 and M is 10 to 5000, such that each of the p-type contact regions has a size of a pixel element;
   forming an n-type contact frame using a photolithography lift off and a metal deposition process;
   performing an etching process to remove material in a plurality of exposed regions while the n-type contact frame and the plurality of p-type contact regions mask underlying regions; causing formation of a plurality of the pixel elements, each of which has been separated from each other, and a trench region to expose a portion of the n-type gallium nitride material during the etching process; and
   forming an n-type contact region comprising a metal fill material overlying an exposed portion of the n-type gallium nitride material wherein the method further comprising forming a conformal passivation layer overlying a surface region of a plurality of exposed regions of the plurality of pixel elements, forming a planarizing layer overlying a topography of the conformal passivation layer; removing a thickness of the planarizing layer to expose an upper region of the n-type contact region and a portion of each of the p-type contact regions, the upper region of the n-type contact region having a portion of the conformal passivation layer and the portion of each of the p-type contact regions having a portion of the conformal passivation layer, and removing the portion of the conformal passivation layer overlying each of the p-type contact regions and the portion of the conformal passivation layer overlying the upper region of the n-type contact region to expose each of the p-type contact regions and expose the n-type contact region.

2. The method of claim 1, wherein the n-type contact regions are configured as a cathode; and each of the p-type contact regions forms an anode for each of the pixel elements; wherein the p-type gallium nitride material comprises a magnesium impurity; and the n-type gallium nitride material comprises a silicon impurity.

3. The method of claim 1, wherein the capping metal layer for the plurality of p-type contact regions acts as a etch mask during the etching process, the etching process being selected from reactive ion etch or inductively coupled plasma etching.

4. The method of claim 1, wherein the n-type contact region is an ohmic contact to the n-type gallium nitride material.

5. The method of claim 1, wherein each of the p-type contact regions is configured as a bump bondable pad.

6. The method of claim 1, wherein the etching process comprises a post cleanup etching using a wet etch or a plasma etch to remove any surface roughness from a primary etching process.

7. The method of claim 1, wherein the n-type contact region provided in the n-type contact frame serves as a sheet contact to form an anode for each pixel element.

8. The method of claim 1, wherein forming the n-type contact region comprises utilizing a liftoff process to metalize the n-type contact region resulting in a formation of a bondable frame structure having a same height as an upper surface of the p-type contact regions.

9. The method of claim 1, wherein the array has a size of about five millimeters to about fifty millimeters along a length of the array.

10. The method of claim 1, wherein the metal fill comprises a titanium entity and a gold entity.

11. The method of claim 1, wherein each pixel element is self-aligned during the etching process.

12. The method of claim 1, wherein the array has an electrical yield of greater than 99.5% or greater.

* * * * *